(12) United States Patent
Kuribara et al.

(10) Patent No.: US 7,376,486 B2
(45) Date of Patent: May 20, 2008

(54) BOARD POSITIONING DEVICE AND BOARD POSITIONING METHOD

(75) Inventors: Shigeru Kuribara, Ota (JP); Hiroaki Ito, Ota (JP); Takuya Imoto, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 315 days.

(21) Appl. No.: 10/920,449

(22) Filed: Aug. 18, 2004

(65) Prior Publication Data

US 2005/0080508 A1    Apr. 14, 2005

(30) Foreign Application Priority Data

Aug. 21, 2003    (JP)    ............... 2003-297578

(51) Int. Cl.
    *G06F 7/00*    (2006.01)
(52) U.S. Cl. ....................... 700/213; 700/230
(58) Field of Classification Search ................ 700/121, 700/229, 228, 95, 108, 109, 116, 213, 66; 198/817, 369.1, 586
    See application file for complete search history.

(56) References Cited

U.S. PATENT DOCUMENTS

| 5,495,661 | A | * | 3/1996 | Gromer et al. ................ 29/740 |
| 5,520,276 | A | * | 5/1996 | Aoki et al. ............... 198/345.1 |
| 5,749,698 | A | * | 5/1998 | Miyoshi ..................... 414/800 |
| 6,073,342 | A |   | 6/2000 | Asai et al. |
| 6,189,674 | B1 |  | 2/2001 | Izumida et al. |
| 6,354,430 | B1 |  | 3/2002 | Oe |
| 6,378,198 | B1 | * | 4/2002 | Asai et al. ..................... 29/825 |
| 6,988,612 | B1 | * | 1/2006 | Kabeshita et al. .......... 198/817 |
| 7,054,707 | B2 | * | 5/2006 | Moriya et al. .............. 700/121 |
| 7,089,066 | B2 | * | 8/2006 | Hesse et al. ................... 700/2 |

FOREIGN PATENT DOCUMENTS

JP    10-070398    3/1998

OTHER PUBLICATIONS

European Search Report dated Jul. 30, 2007, directed to EP Application No. 04019989.5 (3 pages).

* cited by examiner

*Primary Examiner*—Gene O. Crawford
*Assistant Examiner*—Ramya G. Prakasam
(74) *Attorney, Agent, or Firm*—Morrison & Foerster LLP (57) ABSTRACT

This invention provides a board positioning method where a stopper and so on are not required when positioning a printed board in an X direction. Servo motors of a board supplying conveyer portion and a board positioning portion are driven to start carrying of a board. When a first board detection sensor detects the board before timeout of a first timer which starts timekeeping together with the carrying of the board, second and third timers start timekeeping. The servo motor starts decelerating, decelerates to an arbitrary speed, and keeps a constant speed after timeout of the second timer. When a second board detection sensor detects the board before timeout of the third timer, the servo motor is controlled to decelerate and stop the board at an arbitrary position, and a board recognition camera takes an image of a positioning mark of the board stopping at the board positioning portion to recognize a position of the printed board. The CPU controls the servo motors based on a result of the recognition in manufacturing running.

6 Claims, 12 Drawing Sheets

BOARD POSITIONING DEVICE AND BOARD POSITIONING METHOD

CROSS-REFERENCE OF THE INVENTION

This invention is based on Japanese Patent Application No. 2003-297578, the content of which is incorporated by reference in its entirety.

BACKGROUND OF THE INVENTION

1. Field of the Invention

This invention relates to a board positioning device and a board positioning method where a printed board is carried from a board supplying conveyer portion to a board positioning portion and positioned in a carrying direction.

2. Description of the Related Art

Conventionally, in a multifunctional tip mounter for mounting electronic components of various types on a printed board, a cylinder-driven stopper is used for positioning the printed board in an X direction (carrying direction), for example. Relevant arts are disclosed in the Japanese Patent Application Publication No. Hei 10-70398.

In the above conventional art, however, there have been problems that the stopper and its drive source are required when positioning the printed board in the X direction and a shock generated by the stopper when positioning the printed board sometimes makes the printed board broken.

SUMMARY OF THE INVENTION

This invention provides a board positioning device and a board positioning method where a stopper and its drive source are not required when positioning a printed board in an X direction.

The invention provides a board positioning device for positioning a printed board. The device includes a board supplying conveyer portion, a board positioning portion receiving the printed board from the board supplying conveyer portion and positioning the printed board therein, a first motor driving the board supplying conveyer portion, a second motor driving the board positioning portion, a first board detection sensor and a second board detection sensor that is disposed at a lower stream position than the first board detection sensor in a direction of conveying the printed circuit board, a first timer that starts when the board supplying conveyer portion starts conveying the printed board, a second timer and a third timer that start when the first board detection sensor detects the printed board before a timeout of the first timer, a controller to control the first and second motors so that the printed board starts moving, decelerates after a timeout of the second timer and stops at an arbitrary position in the board positioning portion when the second board detection sensor detects the printed board before a timeout of the third timer, a board recognition camera taking an image of a positioning mark provided on the printed board stopping at the arbitrary position, and a recognition processing device recognizing a position of the printed board based on the image taken by the board recognition camera. The controller controls the first and second motors based on the recognized position.

The invention also provides a method for positioning a printed board. The method includes starting conveying the printed board to a positioning location, starting a first timer when the conveying of the printed board starts, starting a second timer and a third timer when a first board detection sensor detects the printed board being conveyed to the positioning location before a timeout of the first timer, starting decelerating the conveyed printed board after a timeout of the second timer, stopping the printed board at an arbitrary position when a second board detection sensor detects the printed board before a timeout of the third timer, moving the printed board from the arbitrary position in a reverse direction until the second board detection sensor stops detecting the printed board, calculating a distance between the arbitrary position and the second board detection sensor before a timeout of the fourth timer, and conveying another printed board to the positioning location based on the calculated distance.

DETAILED DESCRIPTION OF THE INVENTION

Embodiments where a board positioning device and a board positioning method of the invention are applied to a board carrying system of a multifunctional chip mounter (electronic component mounting device) will be described with reference to the attached drawings.

Figure 1:
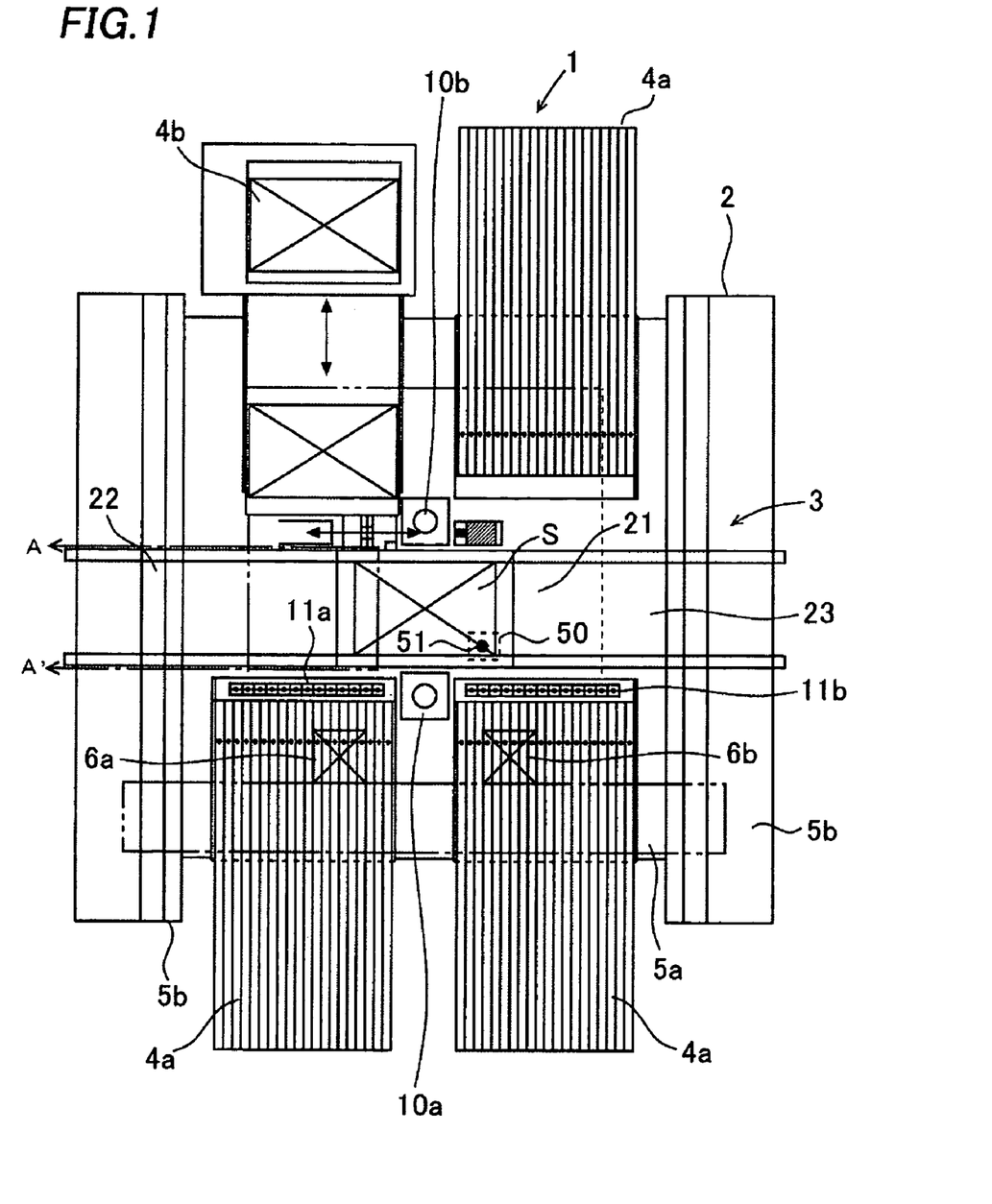
FIG. 1 is a plan view of a mounter of a first embodiment of the invention.

A mounter 1 is configured such that electronic components of various types can be mounted on a printed board S of different types. FIG. 1 is a plan view of a mounter. As shown in FIG. 1, the mounter 1 has a base 2, a board supplying portion 3 extending in a lateral direction at a center of the base 2, and component feeding portions each provided on a front portion (lower side in FIG. 1) and a rear portion (upper side in FIG. 1) of the base 2.

Each of the component feeding portions is arbitrarily provided with a tape cassette feeder 4a for supplying electronic components stored in a tape and a tray feeder 4b for supplying electronic components stored in a tray, for example.

Furthermore, the base 2 has an X beam 5a which enables a first head unit 6a and a second head unit 6b to move in the X direction within a range of the two tape cassette feeders 4a disposed in the front portion of the base 2 (lower side in FIG. 1) or within a range of the tape cassette feeders 4a and the tray feeders 4b disposed in the rear portion of the base 2 (upper side in FIG. 1), and a pair of Y beams 5b which enables the X beam 5a to move in a Y direction from the front portion to the rear portion of the base 2 over the board supplying portion 3.

The X beam 5a has a first head unit 6a and a second head unit 6b for picking and mounting electronic components. Each of the head units 6a and 6b has a mounting head 8 mounted with a suction nozzle 7 (see FIG. 2) and a board recognition camera 50. Furthermore, on the base 2, a pair of component recognition cameras 10a and 10b is respectively provided on each side of the board supplying portion 3, and two nozzle stockers 11a and 11b are provided.

The printed board S is supplied from a left side by the board supplying portion 3, fixed at a center of the base 2, and then discharged to a right side. Description will be given on a case where an electronic component supplied from the two tape cassette feeders 4a disposed in the front portion (lower side in FIG. 1) of the base 2 is mounted on the board S by using the first head unit 6a, for example.

First, the first head unit 6a moves to the required tape cassette feeder 4a by operation of the X beam 5a, and the suction nozzle 7 picks a required electronic component up. Then, on the way to the board by operation of the Y beam 5b, the first head unit 6a moves the electronic component picked by the suction nozzle 7 to the component recognition camera 10a, and the component recognition camera 10a (in the front side of the base 2) recognizes a position of the electronic component. Furthermore, by operation of the Y beam 5b, the first head unit 6a moves to a predetermined position on the board S, the board recognition camera 50 mounted on the first head unit 6a recognizes a position of the board S, and mounts the electronic component on the board S.

The board supplying portion 3 has a board positioning portion 21 provided at a center thereof, a board supplying conveyer portion 22 provided on a left side of the board positioning portion 21 in FIG. 1 and a board discharging conveyer portion 23 provided on a right side of the board positioning portion 21 in FIG. 1. The board S is carried from outside of the device to the board positioning portion 21 by the board supplying conveyer portion 22, fixed on the board positioning portion 21 for being mounted with an electronic component, and supported from a lower side in order to avoid warping when the electronic component is mounted. Then, the board S finished with component mounting is discharged from the board positioning portion 21 to outside through the board discharging conveyer portion 23.

In this operation, when the electronic component is mounted on the board S positioned by the board positioning portion 21, the board S is supported by backup pins 13 described below (see FIG. 2) from a backside of the board S so as to avoid its warping. The positioning of the board S for component mounting differs depending on size, thickness, or whether or not components are previously attached to the backside of the board S. Therefore, many backup pins 13 repeat up and down movement when the board S is changed to boards of other types, in order to change those positionings properly for the new board S.

Figure 2:
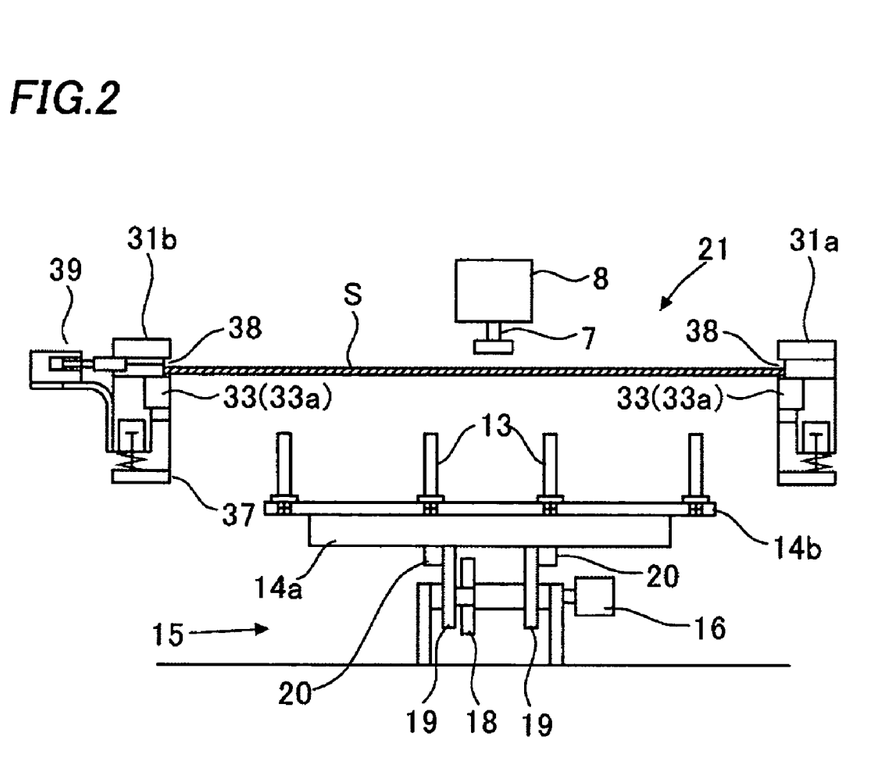
FIG. 2 is a side view of the mounter of FIG. 1 along section A-A' in FIG. 1.
Figure 3A:
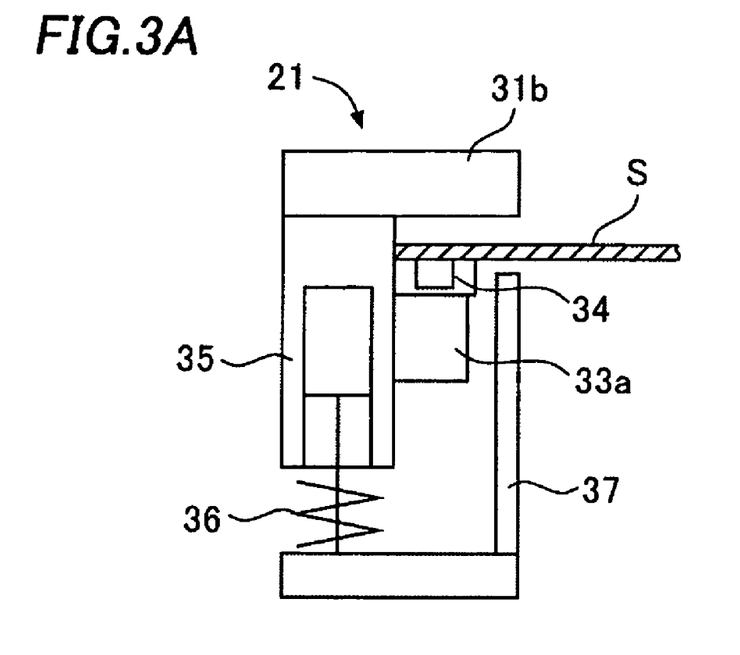
FIGS. 3A and 3B are side views of a main portion of a board positioning portion of the mounter.

Hereafter, the board positioning portion 21 will be described with reference to FIGS. 2 and 3. The board positioning portion 21 has a fixed-side board carrying table 31a and a movable-side board carrying table 31b each supporting front, rear, left, and right portions of the board S, a carrying table moving device (not shown) moving the movable-side board carrying table 31b in front and rear directions corresponding to a width of the board S, and a board carrying device 33 of conveyer type (including conveyer rollers 33a and 33b, and a belt 34 described below) carrying the board S received from the board supplying conveyer portion 22 to predetermined component mounting positions of both the board carrying tables 31a and 31b by a belt and carrying the board S finished with component mounting from the component mounting position to the board discharging conveyer portion 23 by a belt. A numeral 39 designates an air cylinder, which positions the board S to the board supplying portion 3 in a width direction.

Furthermore, in the board positioning portion 21, a vertical shifting lever 37 shifts upward and downward through a presser (e.g. a spring 36) by activation of the air cylinder 39 fixed to the board carrying tables 31a and 31b so that the board S can be attached to and detached from a carrying level of the belt 34. That is, as shown in FIG. 3A, when the vertical shifting lever 37 is shifted to a lower side, the board S is positioned at the carrying level of the belt 34, thereby being carried to a downstream driven by the belt 34. When the vertical shifting lever 37 is shifted to an upper side as shown in FIG. 3B, the board S is positioned above the carrying level, thereby being released from a carrying operation of the belt 34.

The board positioning portion 21 has many backup pins 13 supporting the board S set on the positioning position from a lower side, a backup table 14a set with the many backup pins 13 standing thereon, and a backup pin vertically shifting device 15 (see FIGS. 2 and 5) shifting the backup pins 13 upward and downward through the backup table 14a.

The fixed-side board carrying table 31a and the movable-side board carrying table 31b are disposed facing each other, and the backup table 14a and the backup pin vertical shifting device 15 are disposed below a space between the board carrying tables 31a and 31b. The backup table 14a is formed in a rectangle shape in plan view. A pin setting plate 14b for standing the backup pins 13 is placed on the backup table 14a, and formed with many setting holes for standing the backup pins 13.

The backup table 14a shifts upward and downward by a following manner. The drive motor 16 is driven to rotate itself to make a cam 18 rotate through a belt 17, and a linking body 19 being in contact with the cam 18 rotates along an outer circumference of the cam 18. This rotation of the linking body 19 shifts the backup table 14a upward and downward, being pushed up by the tip portion 20 of the linking body 19.

The fixed-side board carrying table 31a is formed with a guide groove 38 having a U-shape in cross-sectional view for guiding a side end portion of the board S, the guide groove 38 being formed of an inner portion of the fixed-side board carrying table 31a and a conveyer roller 33a of the board carrying device 33 attached to the inner portion. Similarly, the movable-side board carrying table 31b is formed with a guide groove 38 having a U-shape in cross-sectional view for guiding a side end portion of the board S, the guide groove 38 being formed of an inner portion of the movable-side board carrying table 31b and a conveyer roller 33a of the board carrying device 33 attached to the inner portion. Furthermore, the movable-side board carrying table 31b is set with the air cylinder 39 at the guide groove 38, thereby enabling the board S to be pushed and fixed between the fixed-side board carrying table 31a and the movable-side board carrying table 31b.

Figure 5:
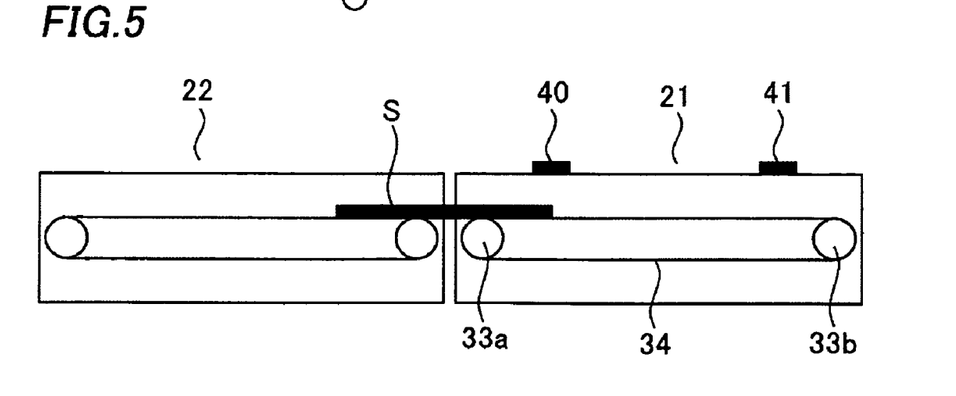
FIG. 5 is an explanatory view showing a carrying operation of a printed board from a board supplying conveyer portion to the board positioning portion of FIG. 4.

Note that a first board detection sensor 40 and a second board detection sensor 41 each serving as a photo sensor for detecting the printed board S are provided in the board positioning portion 21, shown in FIG. 5.

Figure 8:
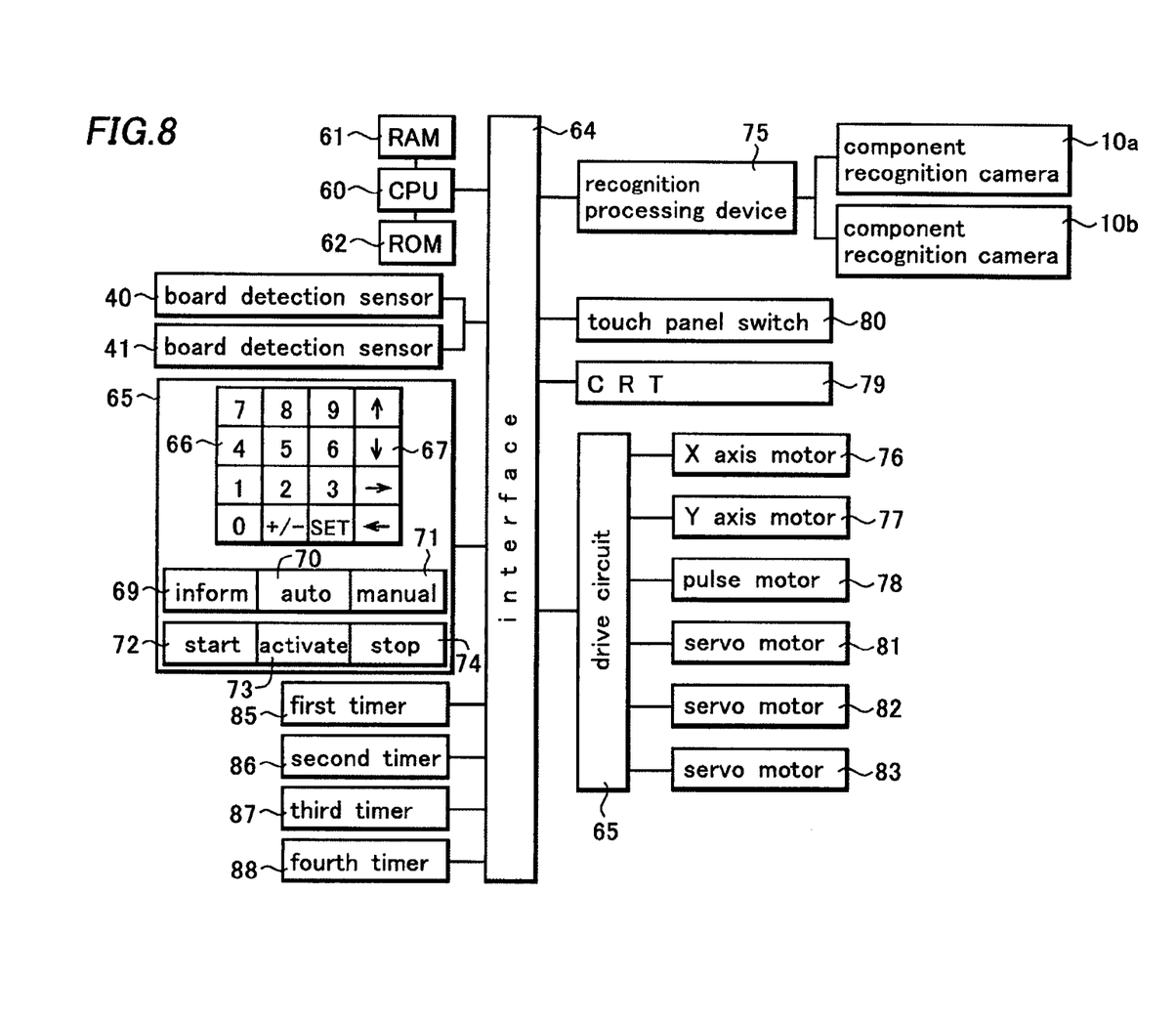
FIG. 8 is a control block diagram of the embodiment.

Next, a control block diagram of a mounter 1 will be described based on FIG. 8. A numeral 60 designates a CPU serving as a control device for controlling component picking and mounting operations of the mounter 1. A numeral 61 designates an RAM (random access memory) serving as a memory device, and a numeral 62 designates an ROM (read only memory). The CPU 60 controls each of drive sources for the component picking and mounting operations of the mounter 1 through an interface 64 and a drive circuit 65 based on data stored in the RAM 61 and according to programs stored in the ROM 62.

The RAM 61 is stored with mounting data including X and Y coordinates and a mounting angle for each of step numbers (in mounting order) and component alignment numbers in the tape cassette feeder 4a, and component data including X and Y sizes for each of the electronic components and numbers of the suction nozzles 7 for use.

A numeral 65 designates an operating portion, having a ten key 66 for keying numbers in, a cursor key 67, a set key 68 for setting mode and so on, an informing key 69 for setting the electronic component mounting device in informing mode, an automation key 70 for setting the electronic component mounting device in automation mode, a manually running key 71 for setting the electronic component mounting device in manually running mode, a start key 72, an activation key 73, and a stop key 74.

A numeral 75 designates a recognition processing device connected with the CPU 60 through the interface 64. The recognition processing device 75 performs recognition processing to images taken and stored by each of the component recognition cameras 10a and 10b, and sends a recognition result to the CPU 60. That is, the CPU 60 outputs a command of performing recognition processing (e.g. calculation of a shifting amount of an electronic component from a normal position) to images taken and stored by each of the component recognition cameras 10a and 10b to the recognition processing device 75, and receives a recognition processing result from the recognition processing device 75.

That is, when the recognition processing device 75 performs recognition processing and detects a shifting amount from a normal position, this recognition result is sent to the CPU 60. Then, the CPU 60 moves the first head unit 6a and the second head unit 6b in X and Y directions by driving the X axis motor 76 of the X beam 5a and the Y axis motor 77 of the Y beam 5b, and rotates the suction nozzle 7 by an angle θ by driving a pulse motor 78, thereby completing correction of the position of the electronic component in the X and Y directions and the rotating angle along a vertical axis.

The images taken by each of the component recognition cameras 10a and 10b are stored in the recognition processing device 75, and the stored images are displayed on the CRT 79. The CRT 79 is provided with various touch panel switches 80 and an operator operates the touch panel switches 80 for various settings including settings for informing.

The touch panel switches 80 include a glass substrate which is coated with a transparent conductive film on its whole surface and printed with electrodes on its four edges. When an operator touches one of the touch panel switches 80 in a state where minimal electric currents flow on the surface of the touch panel switches 80, current flows change at the four electrodes and coordinates of a touched position are calculated by a circuit board connected with the electrodes. If the calculated coordinates correspond to one of coordinates originally stored in the RAM 61 as a switch for executing a certain operation, the operation is executed.

Numerals 81, 82, and 83 are servo motors for driving conveyers of the board supplying conveyer portion 22, the board positioning portion 21, and the board discharging conveyer portion 23 respectively, and operation of each of the servo motors 81, 82, and 83 makes the printed board S on each of the conveyers carried by a belt. Note that these servo motors 81, 82, and 83 are motors which can control each position of the conveyers respectively but can be substituted by a pulse motor, for example.

Basic data on operations of the servo motors 81, 82, and 83 are stored in the ROM 62 for disabling rewriting. Note that the basic data can be stored in the RAM 61 in order to enable rewriting according to a request by a user. Furthermore, in addition to the basic data specified by a manufacturer, a data rewritable region (set arbitrarily) according to a request by a user can be provided in the RAM 61.

Here, these basic data are data on drive waveform of the motors, including automatic start data A, maximum speed data, acceleration/deceleration (incline) data, and carrying distance data of the motors, for example. A carrying time for one carriage can be specified by these data.

Figure 9:
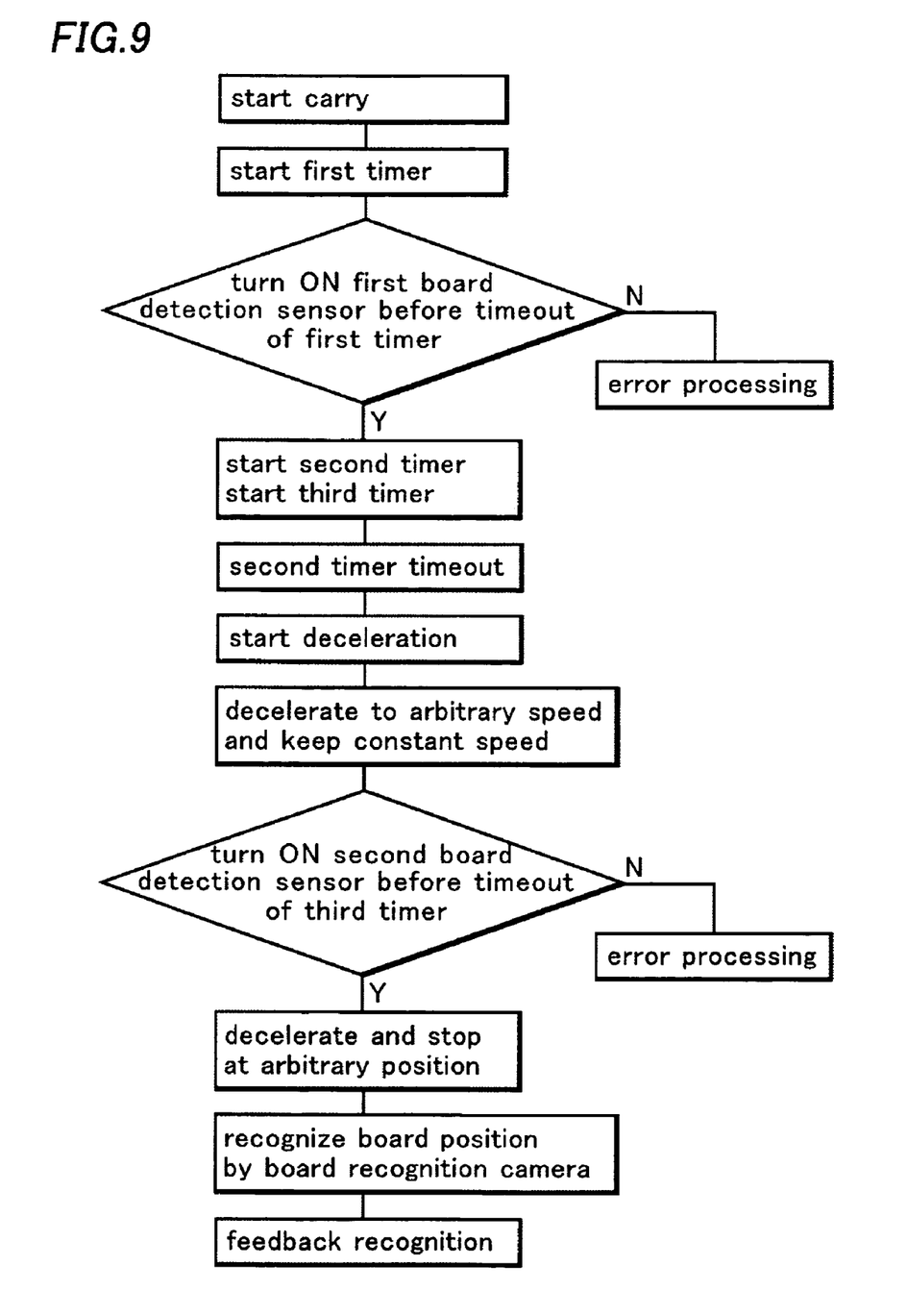
FIG. 9 is a flow chart of teaching running of the first embodiment of the invention.

Next, a flow chart of teaching running of a first embodiment shown in FIG. 9 will be described hereafter. A teaching running is an operation of the mounter to calibrate system and operational deviations. First, when an operator pushes the informing key 69 and the start key 72, carrying of the printed board S starts. That is, the CPU 60 outputs a drive signal to the servo motors 81 and 82 of the board supplying conveyer portion 22 and the board positioning portion 21 through the interface 64 and the drive circuit 65 based on operation signals from the informing key 69 and the start key 72, thereby starting the carrying of the printed board S.

A first timer 85 starts timekeeping at the same time as the start of the carrying of the board S. When the first board detection sensor 40 does not detect the printed board S before timeout of the first timer 85 because the printed board S is caught and stops somewhere, the CPU 60 controls the CRT 79 and other display devices and alarming devices to display an error. When the first board detection sensor 40 detects the printed board S before the timeout of the first timer 85 (FIG. 5), the second and third timers 86 and 87 start timekeeping.

Figure 6:
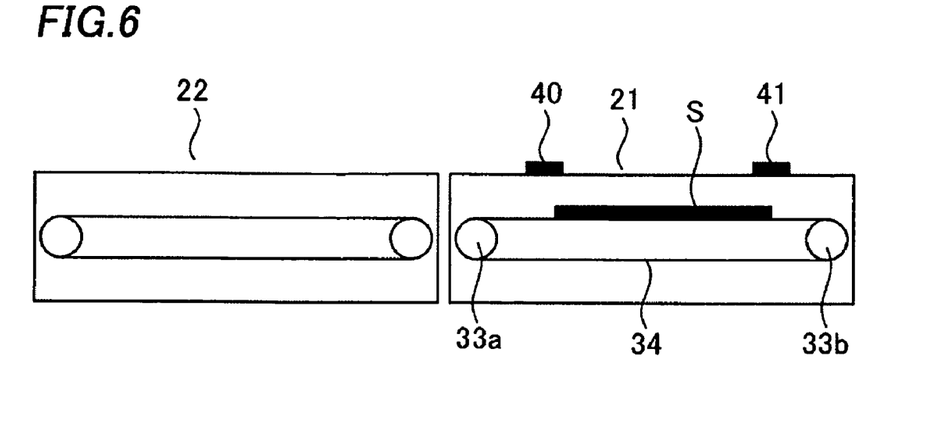
FIG. 6 is an explanatory view showing the carrying operation of the printed board from the board supplying conveyer portion to the board positioning portion.
Figure 7:
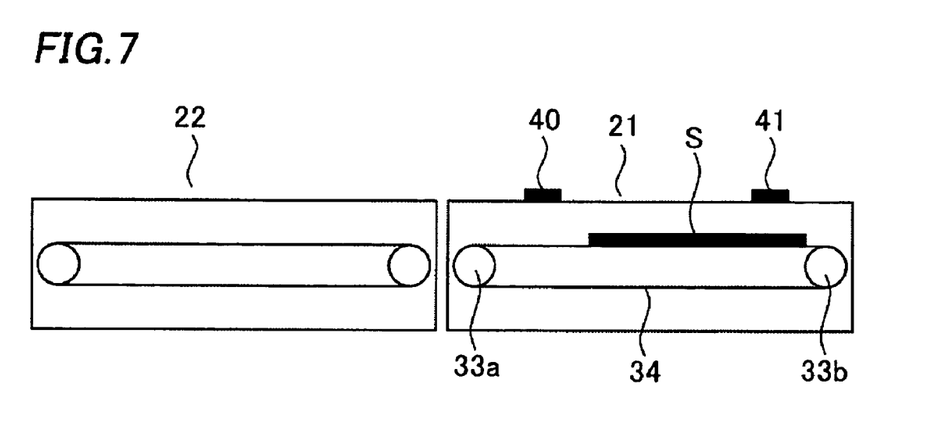
FIG. 7 is an explanatory view showing the carrying operation of the printed board from the board supplying conveyer portion to the board positioning portion.

Then, after timeout of the second timer 86, the CPU 60 controls the servo motors 81 and 82 through the interface 64 and the drive circuit 65 in order to start deceleration of the printed board S, decelerate the printed board S to an arbitrary speed, and keep the printed board S at a constant speed. When the second board detection sensor 41 does not detect the printed board S before timeout of the third timer 87 because the printed board S is caught and stops somewhere, the CPU 60 controls the CRT 79 and other display devices and alarming devices to display an error. When the second board detection sensor 41 detects the printed board S before the timeout of the third timer 87 (FIG. 6), the CPU 60 controls the servo motors 81 and 82 to decelerate the printed board S and then stop the printed board S at an arbitrary position (FIG. 7).

Then, the board recognition camera 50 takes an image of a positioning mark 51 provided on the printed board S stopping at an arbitrary position of the board positioning portion 21, and the recognition processing device 75 performs recognition processing of the image to recognize a position of the printed board S. A result of the recognition is stored in the RAM 61, that is, a plus error is stored in the RAM 61 when a recognized position is on a more forward position than a predetermined set position and a minus error is stored in the RAM 61 when a recognized position is on a more backward position than the set position. This error is adjusted by combining with the carrying distance data stored in the RAM 61 in actual manufacturing running of the printed board S.

Next, an operation relating to the carrying of the printed board S in the manufacturing running will be described based on a flow chart of manufacturing running shown in FIG. 10. First, when an operator pushes the automation key 70 and the start key 72, the carrying of the printed board S starts. That is, the CPU 60 outputs a drive signal to the servo motors 81 and 82 of the board supplying conveyer portion 22 and the board positioning portion 21 through the interface 64 and the drive circuit 65 based on operation signals from the informing key 69 and the start key 72, thereby starting the carrying of the printed board S.

The first timer 85 starts timekeeping at the same time as the start of the carrying of the board S. When the first board detection sensor 40 does not detect the printed board S before timeout of the first timer 85 because the printed board S is caught and stops somewhere, the CPU 60 controls the CRT 79 and other display devices and alarming devices to display an error. When the first board detection sensor 40 detects the printed board S before the timeout of the first timer 85, the second and third timers 86 and 87 start timekeeping.

Then, after timeout of the second timer 86, the CPU 60 controls the servo motors 81 and 82 through the interface 64 and the drive circuit 65 in order to start deceleration of the printed board S, decelerate the printed board S to an arbitrary speed, and keep the printed board S at a constant speed. Then, when the second board detection sensor 41 does not detect the printed board S before timeout of the third timer 87 because the printed board S is caught and stops somewhere, the CPU 60 controls the CRT 79 and other display devices and alarming devices to display an error. When the second board detection sensor 41 detects the printed board S before the timeout of the third timer 87, the CPU 60 controls the servo motors 81 and 82 to decelerate the printed board S and then stop the printed board S at an arbitrary position.

In this operation, the CPU 60 reads out a recognition result of the recognition processing device 75 obtained in the teaching running described above from the RAM 61, and the manufacturing running is performed with feedback based on the recognition result (a plus error or a minus error). In such a manufacturing running, the CPU 60 adjusts a stopping position based on the position detected by encoders of the servo motors 81 and 82 (stop the printed board S at a more backward position by an error amount in a case of a plus error or at a more forward position by an error amount in a case of a minus error) so that the printed board S can decelerate toward an arbitrary position and stop there. That is, error adjustment is performed by using both the error and the carrying distance data stored in the RAM 61.

Figure 11:
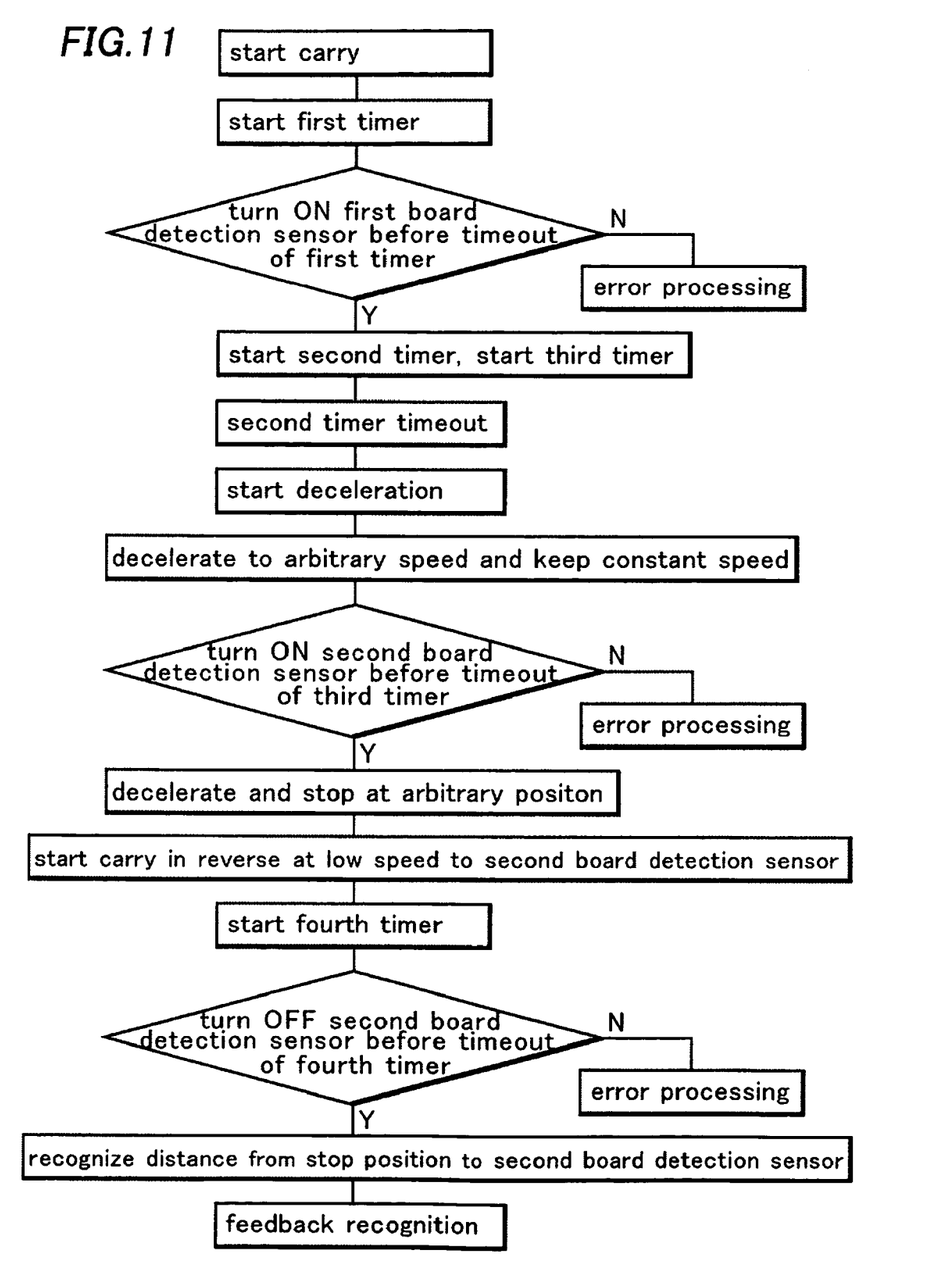
FIG. 11 is a flow chart of teaching running of a second embodiment of the invention.

Next, a flow chart of teaching running of a second embodiment shown in FIG. 11 will be described hereafter. Note that only operations differing from the teaching running of the first embodiment shown in FIG. 9 will be described. As described above, when the board detection sensor 41 detects the printed board S before the timeout of the third timer 87, the CPU 60 controls the servo motors 81 and 82 to decelerate the printed board S and then stop the printed board S at an arbitrary position.

Then, the CPU 60 controls the servo motor 82 to reversely rotate and start the carrying of the printed board S in a reverse direction. This carrying is continued at low speed until the printed board S becomes undetectable by the second board detection sensor 41. At this time, the CPU 60 starts timekeeping of a fourth timer 88 at the same time as sending a command of driving reversely to the servo motors 81. When the second board detection sensor 41 still detects the printed board S at timeout of the fourth timer 88 because the printed board S is caught and stops somewhere, the CPU 60 controls the CRT 79 and other display devices and alarming devices to display an error. When the printed board S becomes undetectable by the second board detection sensor 41 before the timeout of the fourth timer 88, the CPU 60 reads out a content of the encoder of the servo motor 82 through the drive circuit 65, and calculates and recognizes the distance from a position where the printed board S stops to the second board detection sensor 41. Then, the CPU 60 stores a result of the recognition in the RAM 61, and uses the result for feedback in actual manufacturing running of the printed board S. That is, the CPU 60 controls the printed board S to stop at a more backward position by an amount of the distance from the position where the printed board S stops to the second board detection sensor 41.

Figure 10:
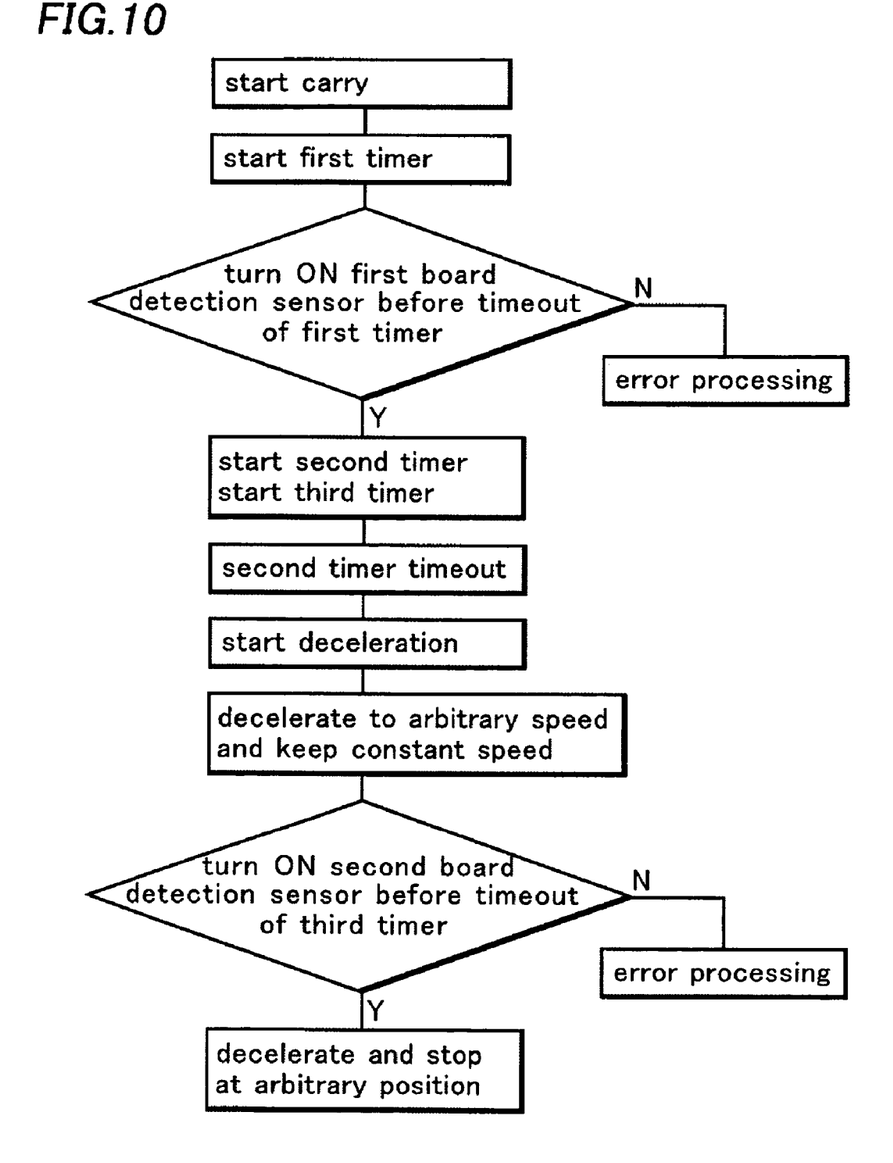
FIG. 10 is a flow chart of manufacturing running of the first embodiment.

An operation relating to the carrying of the printed board S in manufacturing running is the same as the operation shown in the flow chart of the manufacturing running of FIG. 10 described above, and detailed description will be omitted. The CPU 60 reads out the recognition result obtained by the teaching running described above from the RAM 61. The CPU 60 controls the servo motors 81 and 82 to decelerate the printed board S and then stop the printed board S at an arbitrary position which is a position backwardly shifted by an amount of the distance from the position where the printed board S stops to the second board detection sensor 41 based on the recognition result.

Figure 12:
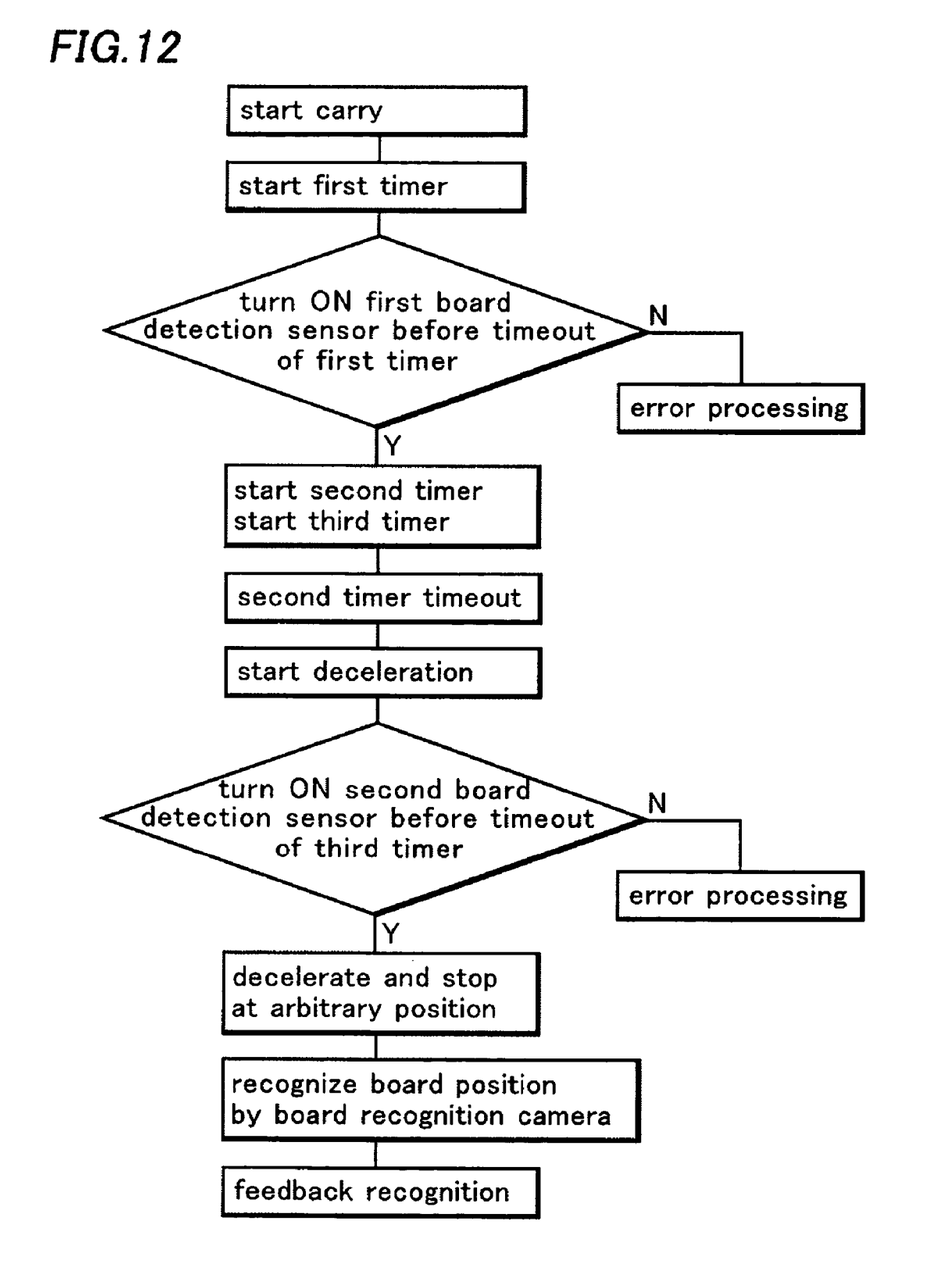
FIG. 12 is a flow chart of teaching running of a third embodiment of the invention.

Next, a flow chart of teaching running of a third embodiment shown in FIG. 12 will be described hereafter. First, when an operator pushes the informing key 69 and the start key 72, carrying of the printed board S starts. That is, the CPU 60 outputs a drive signal to the servo motors 81 and 82 of the board supplying conveyer portion 22 and the board positioning portion 21 through the interface 64 and the drive circuit 65 based on operation signals from the informing key 69 and the start key 72, thereby starting the carrying of the printed board S.

A first timer 85 starts timekeeping at the same time as the start of the carrying of the board S. When the first board detection sensor 40 does not detect the printed board S before timeout of the first timer 85 because the printed board S is caught and stops somewhere, the CPU 60 controls the CRT 79 and other display devices and alarming devices to display an error. When the first board detection sensor 40 detects the printed board S before the timeout of the first timer 85, the second and third timers 86 and 87 start timekeeping.

Then, after timeout of the second timer 86, the CPU 60 controls the servo motors 81 and 82 through the interface 64 and the drive circuit 65 in order to start deceleration of the printed board S. Then, when the second board detection sensor 41 does not detect the printed board S before timeout of the third timer 87 because the printed board S is caught and stops somewhere, the CPU 60 controls the CRT 79 and other display devices and alarming devices to display an error. When the second board detection sensor 41 detects the printed board S before the timeout of the third timer 87, the CPU 60 controls the servo motors 81 and 82 to decelerate the printed board S and then stop the printed board S at an arbitrary position.

Then, the board recognition camera 50 takes an image of a positioning mark 51 provided on the printed board S stopping at the arbitrary position of the board positioning portion 21, and the board processing device 75 performs recognition processing of the image to recognize a position of the printed board S. A result of the recognition is stored in the RAM 61, that is, a plus error is stored in the RAM 61 when a recognized position is on a more forward position than a set position and a minus error is stored in the RAM 61 when a recognized position is on a more backward position than the set position. This error is adjusted by combining with the carrying distance data stored in the RAM 61 in an actual manufacturing running of the printed board S.

Next, an operation relating to the carrying of the printed board S in manufacturing running will be described based on a flow chart of manufacturing running shown in FIG. 13. First, when an operator pushes the automation key 70 and the start key 72, the carrying of the printed board S starts. That is, the CPU 60 outputs a drive signal to the servo motors 81 and 82 of the board supplying conveyer portion 22 and the board positioning portion 21 through the interface 64 and the drive circuit 65 based on operation signals from the informing key 69 and the start key 72, thereby starting the carrying of the printed board S.

The first timer 85 starts timekeeping at the same time as the start of the carrying of the board S. When the first board detection sensor 40 does not detect the printed board S before timeout of the first timer 85 because the printed board S is caught and stops somewhere, the CPU 60 controls the CRT 79 and other display devices and alarming devices to display an error. When the first board detection sensor 40 detects the printed board S before the timeout of the first timer 85, the second and third timers 86 and 87 start timekeeping.

Then, after timeout of the second timer 86, the CPU 60 controls the servo motors 81 and 82 through the interface 64 and the drive circuit 65 in order to start deceleration of the printed board S. Then, when the second board detection sensor 41 does not detect the printed board S before timeout of the third timer 87 because the printed board S is caught and stops somewhere, the CPU 60 controls the CRT 79 and other display devices and alarming devices to display an error. When the second board detection sensor 41 detects the printed board S before the timeout of the third timer 87, the CPU 60 controls the servo motors 81 and 82 to decelerate the printed board S and then stop the printed board S at an arbitrary position.

In this operation, the CPU 60 reads out the recognition result of the recognition processing device 75 obtained by the teaching running described above from the RAM 61, and the manufacturing running is performed with feedback based on the recognition result (a plus error or a minus error). In such a manufacturing running, the CPU 60 adjusts a stopping position based on the position detected by the encoders of the servo motors 81 and 82 (stop the printed board S at a more backward position by an error amount in a case of a plus error or at a position at a more forward position by an error amount in a case of a minus error), so that the printed board S can decelerate toward an arbitrary position and stop there. That is, error adjustment is performed by using both the error and the carrying distance data stored in the RAM 61.

Figure 14:
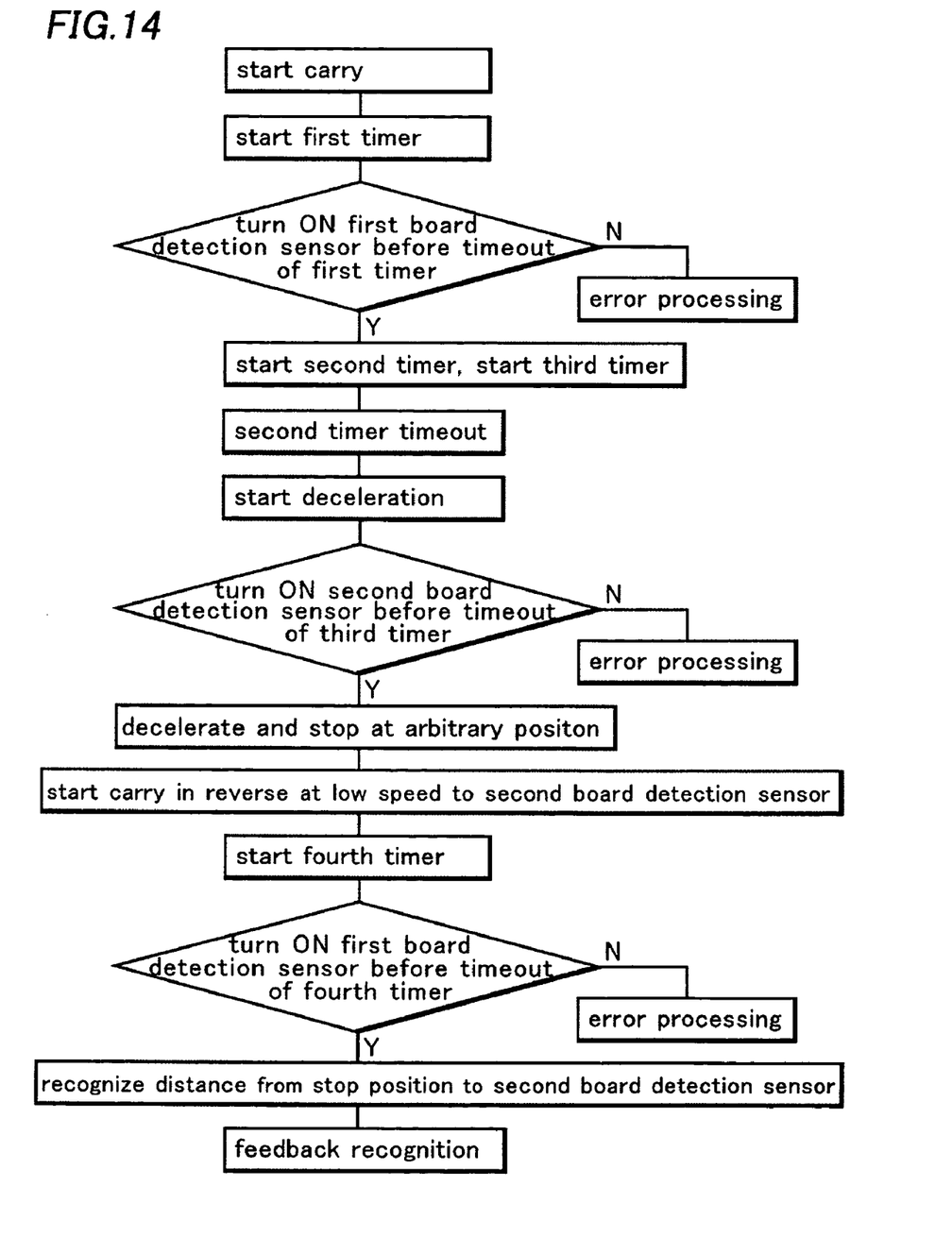
FIG. 14 is a flow chart of teaching running of a fourth embodiment of the invention.

Next, a flow chart of teaching running of a fourth embodiment shown in FIG. 14 will be described hereafter. Note that only operations differing from the teaching running of the third embodiment shown in FIG. 12 will be described. As described above, when the second board detection sensor 41 detects the printed board S before the timeout of the third timer 87, the CPU 60 controls the servo motors 81 and 82 to decelerate the printed board S and then stop the printed board S at an arbitrary position.

Then, the CPU 60 controls the servo motor 82 to reversely rotate and start the carrying of the printed board S in a reverse direction. This carrying is continued at low speed until the printed board S becomes undetectable by the second board detection sensor 41. At this time, the CPU 60 starts timekeeping of a fourth timer 88 at the same time as sending a command of driving reversely to the servo motors 82. When the second board detection sensor 41 still detects the printed board S at timeout of the fourth timer 88 because the printed board S is caught and stops somewhere, the CPU 60 controls the CRT 79 and other display devices and alarming devices to display an error. When the printed board S becomes undetectable by the second board detection sensor 41 before the timeout of the fourth timer 88, the CPU 60 reads out a content of the encoder of the servo motor 82 through the drive circuit 65, and calculates and recognizes a distance from a position where the printed board S stops to the second board detection sensor 41. Then, the CPU 60 stores a result of the recognition in the RAM 61, and uses the result for feedback in actual manufacturing running of the printed board S. That is, the CPU 60 controls the printed board S to stop at a more backward position by an amount of the distance from the position where the printed board S stops to the second board detection sensor 41.

Figure 13:
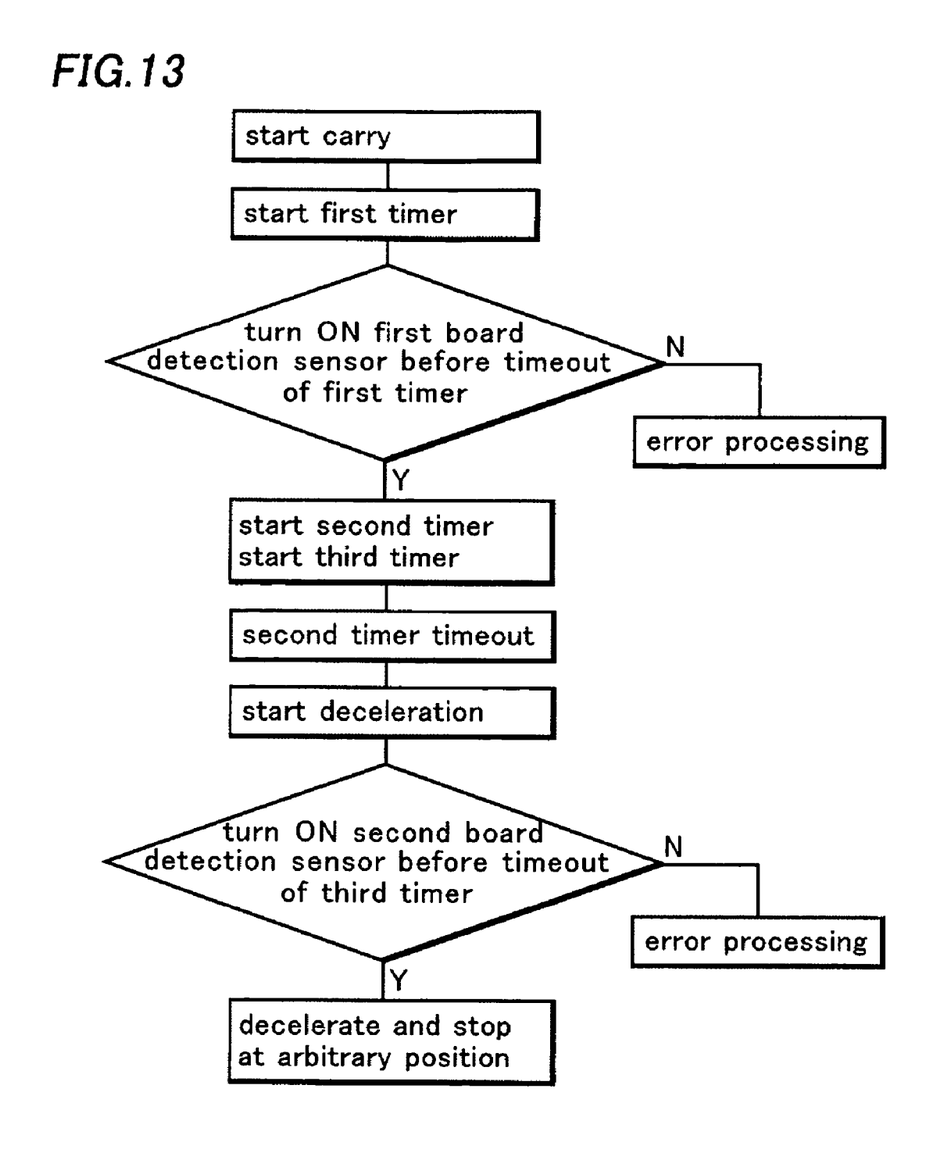
FIG. 13 is a flow chart of manufacturing running of the third embodiment.

An operation relating to the carrying of the printed board S in manufacturing running is the same as the operation shown in the flow chart of the manufacturing running of FIG. 13 described above, and detailed description will be omitted. The CPU 60 reads out the recognition result obtained by the teaching running described above from the RAM 61. The CPU 60 controls the servo motors 81 and 82 to decelerate the printed board S and then stop the printed board S at an arbitrary position which is a position backwardly shifted by an amount of the distance from the position where the printed board S stops to the second board detection sensor 41 based on the recognition result.

As described above, when the manufacturing running starts, the printed board S is carried from the board supplying conveyer portion 22 to the board positioning portion 21, and stops at a predetermined position of the board positioning portion 21.

Figure 3B:
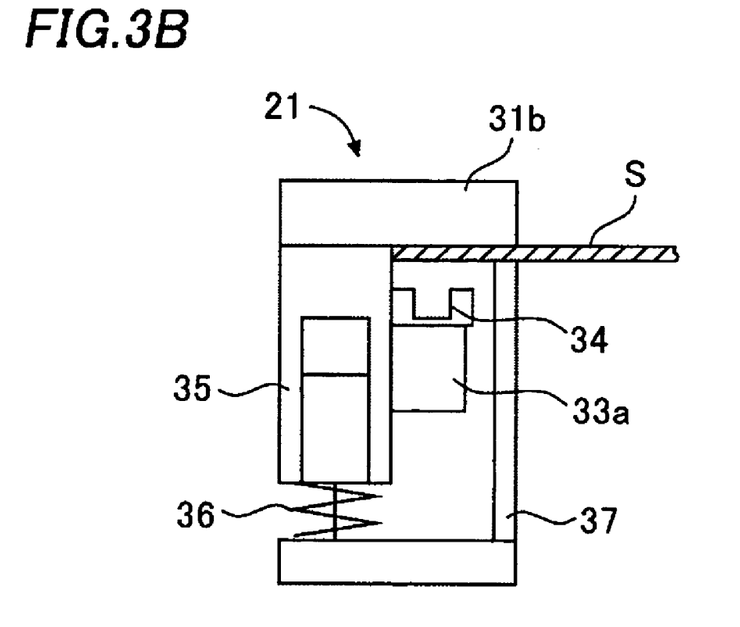
Figure 4:
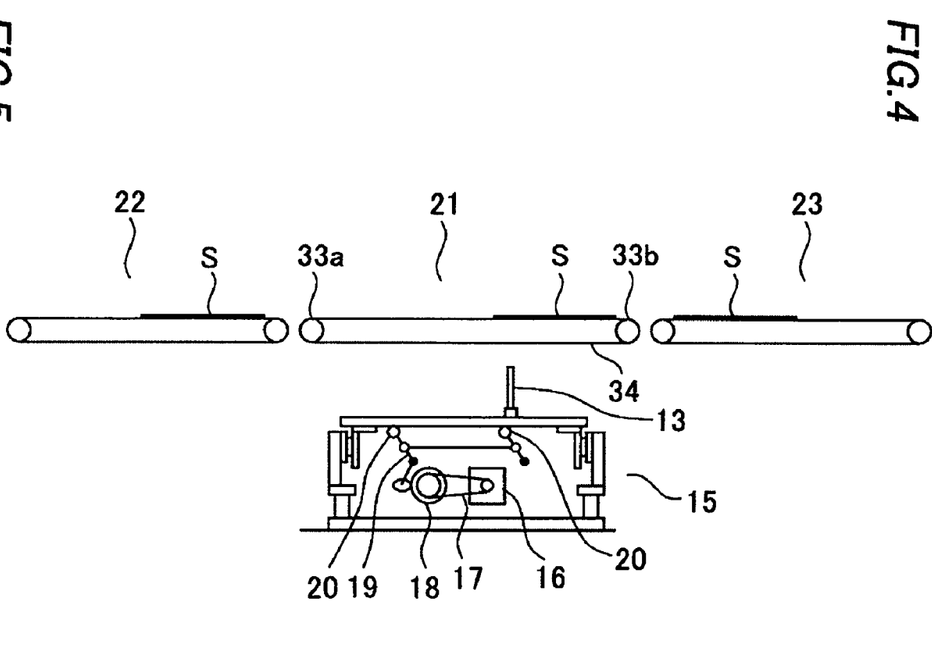
FIG. 4 is a front view of a board carrying device of the mounter.

Then, the air cylinder 39 is activated to fix the printed board S immovably in a width direction and upwardly shift the printed boards by upwardly shifting the vertical shifting lever 37 (FIG. 3B). Next, the backup pin vertically shifting device 15 is activated to upwardly shift the printed board S to a mounting position and keep it horizontal there. Then, a component mounting operation by the mounting head 8 is performed at this position.

Then, a carrying operation of the printed board S finished with the component mounting operation starts. In this operation, the air cylinder 39 is activated to downwardly shift the printed board S positioned at a mounting operation level to a carrying level of the conveyer. Then, the printed board S is carried to the side of the board discharging conveyer portion 23 by conveyer driving of the board positioning portion 21 and the board discharging conveyer portion 23. After this, the board carrying operation and the component mounting operation will be repeated similarly.

In the invention described above, a motor which enables positional control, for example, a pulse motor, servo motor, and so on is used as a conveyer driving system for carrying a board so that accuracy in stopping can be improved more than the conventional structure.

Therefore, a shock occurred by stopping can be reduced more than a conventional case where a printed board is stopped by contacting a positioning stopper thereto. Furthermore, positional shifting of a mounted component caused by the shock can be prevented. Furthermore, high accuracy in stopping can omit the positioning stopper, thereby encouraging cost reduction.

Although one example where the invention is applied to a mounter is described in the embodiments, the invention is not limited to the embodiments and can be applied to devices of various types having a board carrying system.

Although particular preferred embodiment of the invention has been disclosed in detail, it will be recognized that variations or modifications of the disclosed apparatus are possible based on the disclosure for those skilled in the art and lie within the scope of the present invention.

What is claimed is:

1. A board positioning device for positioning a printed board, comprising:
   a board supplying conveyer portion;
   a board positioning portion receiving the printed board from the board supplying conveyer portion and positioning the printed board therein;
   a first motor driving the board supplying conveyer portion;
   a second motor driving the board positioning portion;
   a first board detection sensor and a second board detection sensor that is disposed at a lower stream position than the first board detection sensor in a direction of conveying the printed circuit board;
   a first timer that starts when the board supplying conveyer portion starts conveying the printed board;
   a second timer and a third timer that start when the first board detection sensor detects the printed board before a timeout of the first timer;
   a controller to control the first and second motors so that the printed board starts moving, decelerates after a timeout of the second timer and stops at an arbitrary position in the board positioning portion when the second board detection sensor detects the printed board before a timeout of the third timer;
   a fourth timer; and
   a recognition device, wherein
   the controller controls the first and second motors so that the printed board moves from the arbitrary position in a reverse direction until the second board detection sensor stops detecting the printed board and that the fourth timer starts with the start of the reverse moving,
   the recognition device calculates a distance between the arbitrary position and the second board detection sensor based on a reading of an encoder of the second motor corresponding to the stopping of the detecting the printed board before a timeout of the fourth timer, and
   the controller controls the first and second motors based on the calculated distance.

2. The board positioning device of claim 1, wherein the controller controls the second motor so that the printed board decelerates to and keeps an arbitrary speed.

3. The board positioning device of claim 1, wherein the controller controls the first and second motors based on the calculated distance when the printed board is positioned for mounting electronic components.

4. A method for positioning a printed board, comprising:
   starting conveying the printed board to a positioning location;
   starting a first timer when the conveying of the printed board starts;
   starting a second timer and a third timer when a first board detection sensor detects the printed board being conveyed to the positioning location before a timeout of the first timer;
   starting decelerating the conveyed printed board after a timeout of the second timer;
   stopping the printed board at an arbitrary position when a second board detection sensor detects the printed board before a timeout of the third timer;
   moving the printed board from the arbitrary position in a reverse direction until the second board detection sensor stops detecting the printed board;
   starting a fourth timer when the reverse moving starts;
   calculating a distance between the arbitrary position and the second board detection sensor before a timeout of the fourth timer; and
   conveying another printed board to the positioning location based on the calculated distance.

5. The method of claim 4, further comprising decelerating the printed board to an arbitrary speed and keeping the printed board at the arbitrary speed after the timeout of the second timer.

6. The method of claim 4, wherein said another printed board is positioned for mounting electronic components.

* * * * *